(12) United States Patent
Ramappa

(10) Patent No.: US 7,902,091 B2
(45) Date of Patent: Mar. 8, 2011

(54) CLEAVING OF SUBSTRATES

(75) Inventor: Deepak A. Ramappa, Cambridge, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 12/538,903

(22) Filed: Aug. 11, 2009

(65) Prior Publication Data

US 2010/0041246 A1 Feb. 18, 2010

Related U.S. Application Data

(60) Provisional application No. 61/088,475, filed on Aug. 13, 2008.

(51) Int. Cl.
*H01L 21/00* (2006.01)
(52) U.S. Cl. .. 438/795; 438/455; 438/458; 257/E21.001; 257/E21.328
(58) Field of Classification Search .......... 438/458, 438/795, 798; 257/E21.001, E21.328
See application file for complete search history.

(56) References Cited

U.S. PATENT DOCUMENTS

| | | | |
|---|---|---|---|
| 5,374,564 A | 12/1994 | Bruel | |
| 5,670,391 A | 9/1997 | Lim et al. | |
| 5,972,782 A | 10/1999 | Ostapenko | |
| 6,162,705 A | 12/2000 | Henley et al. | |
| 6,225,192 B1 | 5/2001 | Aspar et al. | |
| 6,358,823 B1 | 3/2002 | Krueger et al. | |
| 6,387,829 B1 | 5/2002 | Usenko et al. | |
| 6,413,789 B2 | 7/2002 | Ostapenko | |
| 6,429,104 B1 | 8/2002 | Auberton-Herve | |
| 6,458,672 B1 | 10/2002 | Henley et al. | |
| 2002/0106870 A1 | 8/2002 | Henley et al. | |
| 2005/0059226 A1 | 3/2005 | Rouh et al. | |
| 2009/0057791 A1 * | 3/2009 | Akiyama et al. | 257/414 |
| 2009/0181492 A1 | 7/2009 | Nunan et al. | |

FOREIGN PATENT DOCUMENTS

JP 402056928 A * 2/1990

OTHER PUBLICATIONS

Treatment of semiconductor wafer, Iwamatsu Seiichi, English Abstract of JP 402056928 A, Feb. 26, 1990.*
Buyanova et al., Ultrasound Regeneration of EL2 Centres in GaAs, Semicond. Sci. Tech. 1994, pp. 158-162, vol. 9 (UK).
Romanyuk et al., Influence of in Situ Ultrasound Treatment During Ion Implantation on Formation of Silver Nanoparticles in Silica, J. of App. Physics, 2006, 99, 034314 1-4 (Melville, NY).

(Continued)

*Primary Examiner* — Angel Roman

(57) ABSTRACT

An improved process of substrate cleaving and a device to perform the cleaving are disclosed. In the traditional cleaving process, a layer of microbubbles is created within a substrate through the implantation of ions of a gaseous species, such as hydrogen or helium. The size and spatial distribution of these microbubbles is enhanced through the use of ultrasound energy. The ultrasound energy causes smaller microbubbles to join together and also reduces the straggle. An ultrasonic transducer is acoustically linked with the substrate to facilitate these effects. In some embodiments, the ultrasonic transducer is in communication with the platen, such that ultrasound energy can be applied during ion implantation and/or immediately thereafter. In other embodiments, the ultrasonic energy is applied to the substrate during a subsequent process, such as an anneal.

18 Claims, 9 Drawing Sheets

OTHER PUBLICATIONS

Kruger et al., Influence of In Situ Ultrasound Treatment During Ion Implantation on Amorphization and Junction Formation in Silicon, J. Vac. Sci. Tech. B, Jul./Aug. 2002, pp. 1448-1451, vol. 20(4) (Research Triangle Park, NC).

Ostapenko et al., Change of Minority Carrier Diffusion Length in Polycrystalline Silicon by Ultrasound Treatment, Semicond. Sci. Tech. 1995, pp. 1494-1500, vol. 10 (UK).

Romanyuk et al., Modification of the Si Amorphization Process by In Situ Ultrasonic Treatment During Ion Implantation, Semicond. Sci. Tech. 2001, pp. 397-401, vol. 16 (UK).

* cited by examiner

CLEAVING OF SUBSTRATES

This application claims priority of U.S. Provisional Patent Application No. 61/088,475, filed Aug. 13, 2008, the disclosure of which is herein incorporated by reference in its entirety.

FIELD

This invention relates to substrate cleaving, and, more particularly, to a process that improves substrate cleaving using ultrasound energy.

BACKGROUND

An ion implanter includes an ion source for converting a gas or a solid material into a well-defined ion beam. The ion beam typically is mass analyzed to eliminate undesired ion species, accelerated to a desired energy, and implanted into a target. The ion beam may be distributed over the target area by electrostatic or magnetic beam scanning, by target movement, or by a combination of beam scanning and target movement. The ion beam may be a spot beam or a ribbon beam having a long dimension and a short dimension.

Implantation of an ion species may allow a substrate to be cleaved. The species form microbubbles in the substrate material. These microbubbles are pockets of a gas or regions of an implanted species below the surface of the substrate that may be arranged to form a weakened layer or porous layer in the substrate. A later process, such as heat, fluid, chemical, or mechanical force, is then used to separate the substrate into two layers along the weakened layer or porous layer.

For example, hydrogen or helium may be used to induce cavitation, or cavities caused by microbubbles, at a predetermined depth of a substrate. A thermal treatment after the implantation may be used to aggregate the hydrogen or helium. Clustering of the hydrogen or helium will build pressure in the cavities formed by the microbubbles. A shear force, such as that found after attaching the substrate to another substrate, will cleave a thin layer off the substrate. The thickness of the thin layer depends on the depth to which the hydrogen or helium was implanted.

Ostwald ripening may occur in substrates that have microbubbles. Ostwald ripening is a thermodynamic process where larger particles grow by drawing material from smaller particles because larger particles are more stable than smaller particles. Any atoms or molecules on the surface of a particle, which may be, for example, a microbubble, are energetically less stable than the more ordered atoms or molecules in the interior of a particle. This is partly because any atom or molecule on the surface of a particle is not bonded to the maximum possible number of neighboring atoms or molecules, and, therefore, is at a higher energy state than those atoms or molecules in the interior. The unsatisfied bonds of these surface atoms or molecules give rise to surface energy. A large particle, with a greater volume-to-surface ratio, will have a lower surface energy. To lower surface energy, atoms or molecules on the surface of smaller, less stable particles will diffuse and add to the surface of the larger, more stable particles. The shrinking of smaller particles will minimize total surface area and, therefore, surface energy. Thus, smaller particles continue to shrink and larger molecules continue to grow.

FIG. 1 is a view of Ostwald ripening in a substrate. FIG. 1 is merely an illustration and is not to scale, although the $x_1$ and $x_2$ references will allow comparison of FIGS. 1-2. A species that forms the microbubbles 100 in the substrate 138 makes smaller microbubbles 101 and larger microbubbles 102. Due to their greater volume-to-surface ratio and lower surface energy, the larger microbubbles 102 will be more stable than the smaller microbubbles 101. To lower their surface energy, the smaller microbubbles 101 will diffuse to the larger microbubbles 102. Overall, the smaller microbubbles 101 may shrink and the larger microbubbles 102 may grow. Some of the species in the microbubbles 100 also may diffuse out of the substrate 138 or some smaller microbubbles 101 will diffuse together to form a larger microbubble 102. Ostwald ripening and diffusion will affect the substrate 138 when it is cleaved along the weakened layer or porous layer represented by line 103.

FIG. 2 is a view of the substrate of FIG. 1 after the substrate is cleaved. The substrate 138 in FIG. 1 was cleaved along the weakened layer or porous layer represented by line 103. As illustrated in FIG. 2, significant surface roughness 104 occurs due to Ostwald ripening and diffusion of the species. Due to the rough surface within a substrate when the substrate is separated into two layers along the weakened layer or porous layer, a polishing step after the substrate is cleaved may be required to make the surface of the substrate smooth enough for device manufacture. This polishing step is expensive and compromises the uniformity of the silicon on the surface of the substrate.

Implanting a species to cleave a substrate also typically has other shortcomings or inefficiencies besides the surface roughness. For example, a large dose of the implant species is usually required. For single crystal silicon, this dose may be more than $3E16$ cm$^{-2}$. A significant percentage of this implanted species will diffuse out of the substrate, which contributes to the high implant dose requirement. Furthermore, a complex combination of gas implants may be required to enhance the pressure in the cavities formed by the microbubbles. For example, hydrogen may be used to form cavities and helium may be used to increase pressure within these cavities. Accordingly, there is a need in the art for an improved process of substrate cleaving, and, more particularly, for a process that improves substrate cleaving using ultrasound energy.

SUMMARY

An improved process of substrate cleaving and a device to perform the cleaving are disclosed. In the traditional cleaving process, a layer of microbubbles is created within a substrate through the implantation of ions of a gaseous species, such as hydrogen or helium. These microbubbles may be of various sizes and at various depths within the substrate.

The size and spatial distribution of these microbubbles is enhanced through the use of ultrasound energy. The ultrasound energy causes smaller microbubbles to join together and also reduces the straggle. These factors combine to improve the cleaving process. For example, due to the aggregation of microbubbles, the dose may be reduced. Furthermore, the force needed to cleave the substrate may be reduced. Finally, the cleaved surface may be smoother due to the reduced straggle.

An ultrasonic transducer is acoustically coupled with the substrate to facilitate these effects. In some embodiments, the ultrasonic transducer is in communication with the platen, such that ultrasound energy can be applied during ion implantation and/or immediately thereafter. In other embodiments, the ultrasonic energy is applied to the substrate during a subsequent process, such as anneal.

BRIEF DESCRIPTION OF THE DRAWINGS

For a better understanding of the present disclosure, reference is made to the accompanying drawings, which are incorporated herein by reference and in which.

DETAILED DESCRIPTION

Figure 1:
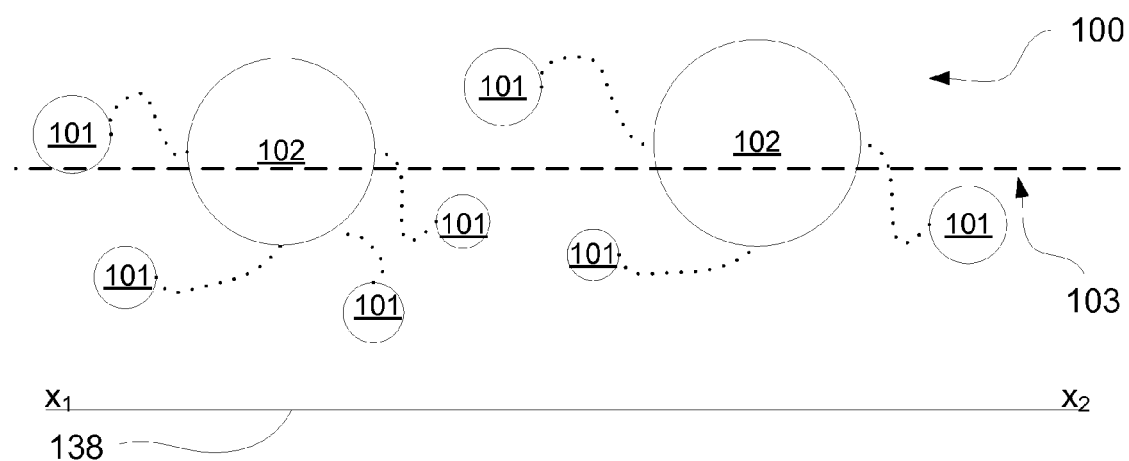
FIG. 1 is a view of Ostwald ripening in a substrate.
Figure 2:
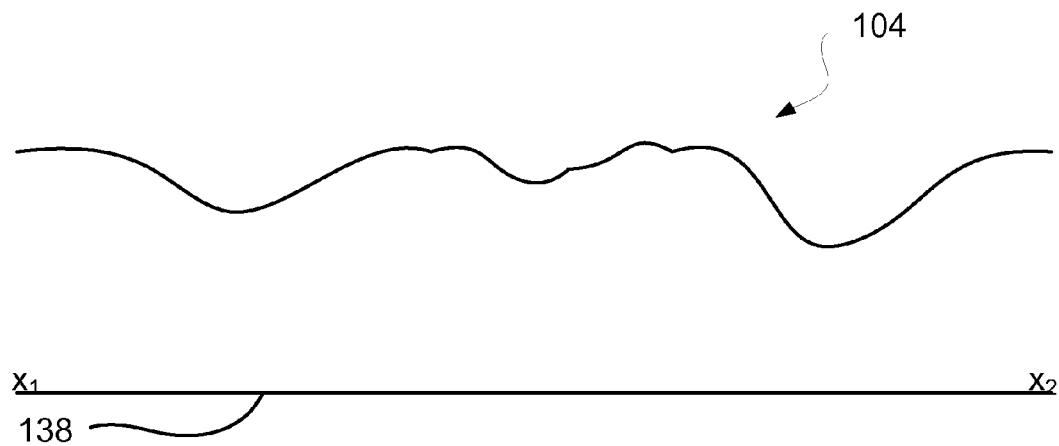
FIG. 2 is a view of the substrate of FIG. 1 after the substrate is cleaved.
Figure 3:
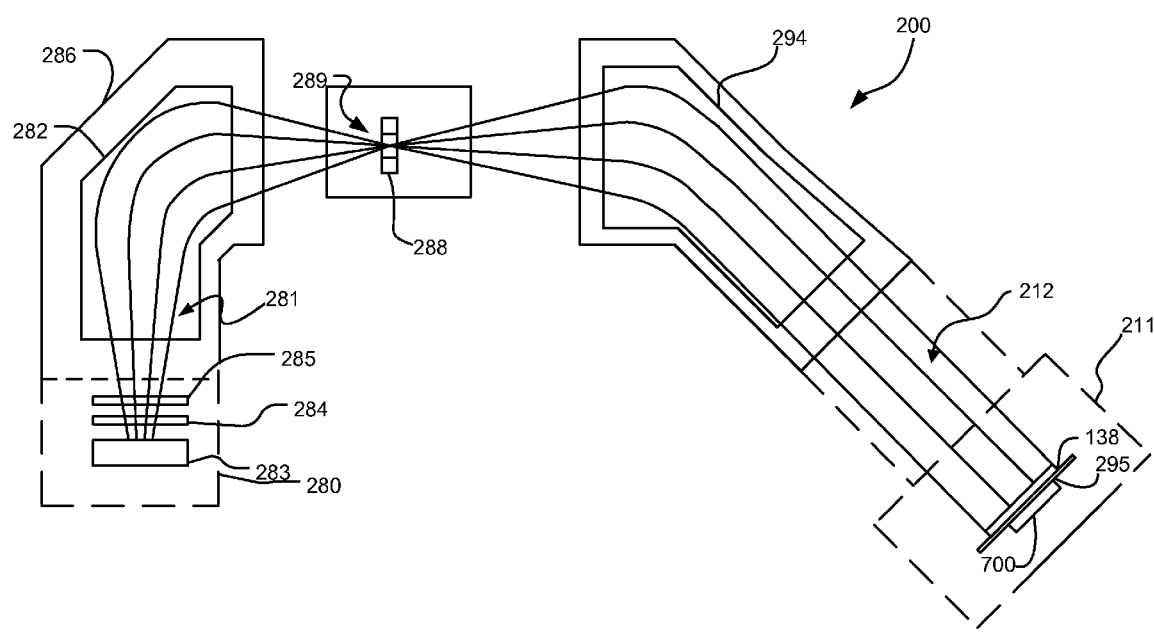
FIG. 3 is a block diagram of a beam-line ion implanter for doping a material with ions.

Turning to FIG. 3, a block diagram of a beam-line ion implanter 200 that may provide ions for doping a selected material is illustrated. Those skilled in the art will recognize that the beam-line ion implanter 200 is only one of many examples of beam-line ion implanters that can provide ions for doping a selected material. Thus, this process is not limited solely to the beam-line ion implanter 200 of FIG. 3.

In general, the beam-line ion implanter 200 includes an ion source 280 to generate ions that form an ion beam 281. The ion source 280 may include an ion chamber 283 and a gas box containing a gas to be ionized or a vaporizer to vaporize a solid to form a gas. The gas is supplied to the ion chamber 283 where the gas is ionized. This gas may be or may include or contain, in some embodiments, hydrogen, helium, other rare gases, oxygen, nitrogen, arsenic, boron, phosphorus, carborane $C_2B_{10}H_{12}$, or another large molecular compound. The ions thus formed are extracted from the ion chamber 283 to form the ion beam 281. The ion beam 281 is directed between the poles of resolving magnet 282. A power supply is connected to an extraction electrode of the ion source 280 and provides an adjustable voltage.

The ion beam 281 passes through a suppression electrode 284 and ground electrode 285 to mass analyzer 286. Mass analyzer 286 includes resolving magnet 282 and masking electrode 288 having resolving aperture 289. Resolving magnet 282 deflects ions in the ion beam 281 such that ions of a desired ion species pass through the resolving aperture 289. Undesired ion species do not pass through the resolving aperture 289, but are blocked by the masking electrode 288. In one embodiment, resolving magnet 282 deflects ions of the desired species by about 90°.

Ions of the desired ion species pass through the resolving aperture 289 to the angle corrector magnet 294. Angle corrector magnet 294 deflects ions of the desired ion species and converts the ion beam from a diverging ion beam to ribbon ion beam 212, which has substantially parallel ion trajectories. The beam-line ion implanter 200 may further include acceleration or deceleration units in some embodiments.

An end station 211 supports one or more substrates, such as substrate 138, in the path of ribbon ion beam 212 such that ions of the desired species are implanted into substrate 138. The substrate 138 may be, for example, a silicon wafer. The end station 211 may include a platen 295 to support the substrate 138 and an ultrasonic transducer 700. The end station 211 also may include a scanner (not shown) for moving the substrate 138 perpendicular to the long dimension of the ribbon ion beam 212 cross-section, thereby distributing ions over the entire surface of substrate 138. Although the ribbon ion beam 212 is illustrated, other embodiments may provide a spot beam.

Platen 295 traditionally consists of several layers. The first, or top, layer, which contacts the substrate, is made of an electrically insulating or semiconducting material, such as alumina, since it must produce the electrostatic field without creating a short circuit. In some embodiments, this layer is about 4 mils thick. For those embodiments using coulombic force, the resistivity of the top layer, which is typically formed using crystalline and amorphous dielectric materials, is typically greater than $10^{14}$ Ω-cm. For those embodiments utilizing Johnsen-Rahbeck force, the volume resistivity of the top layer, which is formed from a semiconducting material, is typically in the range of $10^{10}$ to $10^{12}$ Ω-cm. The coulombic force can be generated by an alternating voltage (AC) or by a constant voltage (DC) supply.

Directly below this layer is a layer of electrically conductive material, which contains the electrodes that create the electrostatic field. This layer is made using electrically conductive materials, such as silver. Patterns are created in this layer, much like are done in a printed circuit board to create the desired electrode shapes and sizes. Below this conductive layer is a second insulating layer, which is used to separate the conductive layer of the platen from the lower portion.

The lower portion is preferably made from metal or metal alloy with high thermal conductivity to maintain the overall temperature of the platen 295 within an acceptable range. In many applications, aluminum is used for this bottom layer. In some embodiments, this bottom layer has two separate aluminum portions. The lower portion is thick and contains fluid passageways. Typically, the top surface of an aluminum block is machined to introduce channels through which coolant is passed. The coolant can be any suitable fluid, including water and de-ionized water. A much thinner second aluminum plate is formed to act as a lid for this thicker aluminum block, providing a cover for these machined passageways. These two aluminum portions are bonded together to form the thermally conductive lower layer of the platen 295. This layer and the previously described electrically non-conductive layer are then mechanically affixed together, such as by epoxy, brazing material or other adhesive technique.

In addition to the fluid conduits that are used to cool the platen, there may be other conduits used to carry gas to the top surface of the platen 295. These conduits are used to pump gas, known as backside gas, to the underside of the workpiece. This gas helps improve the thermal transfer between the workpiece and the platen.

The ion implanter may include additional components known to those skilled in the art. For example, the end station 211 typically includes automated substrate handling equipment for introducing substrates into the beam-line ion implanter 200 and for removing substrates after ion implantation. The end station 211 also may include a dose measuring system, an electron flood gun, or other known components. It will be understood to those skilled in the art that the entire path traversed by the ion beam is evacuated during ion implantation. The beam-line ion implanter 200 may incorporate hot or cold implantation of ions in some embodiments.

One skilled in the art will recognize other systems and processes involved in semiconductor manufacturing, other systems and processes involved in plasma treatment, or other systems and processes that use accelerated ions that may perform the cleaving implant process described herein. Some examples of this, for example, are a plasma doping tool, an ion shower, or a plasma immersion tool. Other semiconductor processing equipment known to those skilled in the art that can accelerate species and implant species into a substrate also may be used. Thus, this process is not limited solely to beam-line ion implanters.

Figure 4:
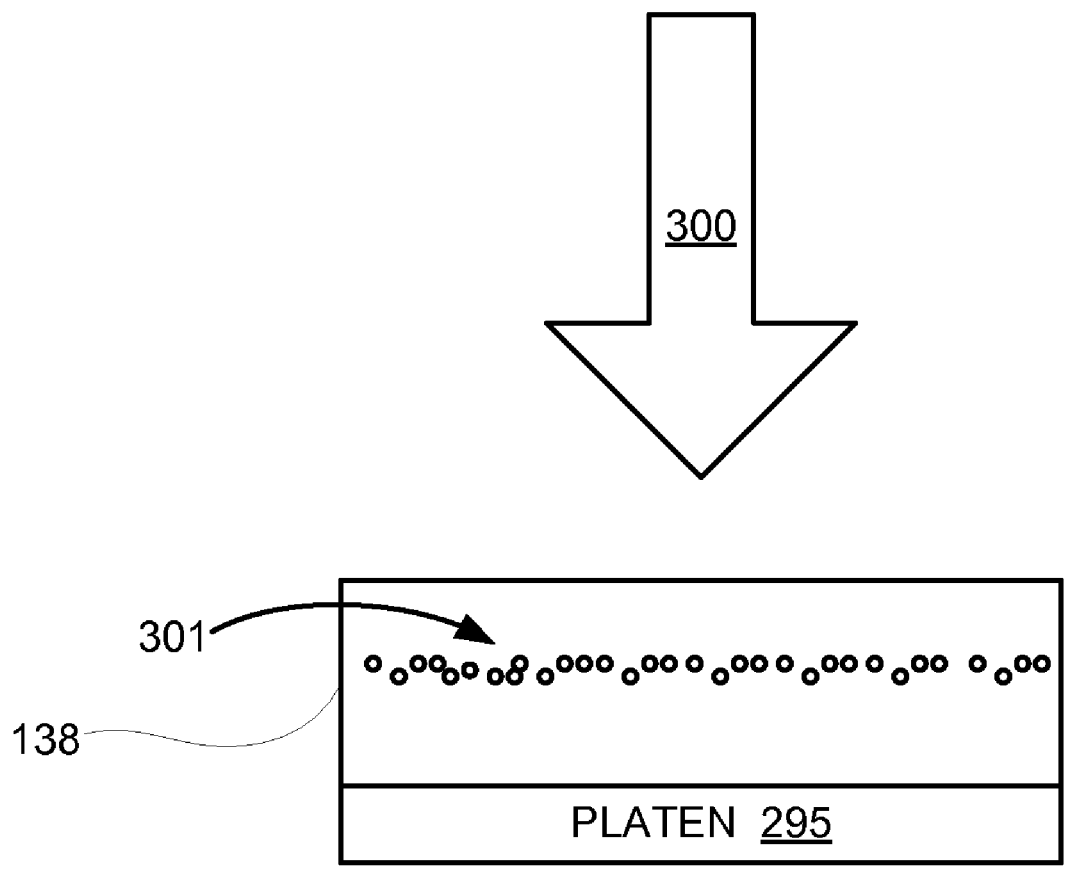
FIG. 4 is an embodiment of an implanted substrate with a layer of microbubbles.

FIG. 4 is an embodiment of an implanted substrate with a layer of microbubbles. A species 300, which may be at least one chemical element in this particular embodiment, is implanted into the substrate 138. The species 300 forms microbubbles 301 that create cavities in the substrate 138. The substrate is later cleaved along this layer of microbubbles 301. The species 300 may be hydrogen, helium, oxygen, fluorine, nitrogen, argon, krypton, xenon, other rare gases, or a combination of gases that are used to form the layer of microbubbles 301. This may be performed in one implant or a series of implants. Other species known to those skilled in the art also may be used to form the layer of microbubbles 301. Greater implant energy of the species 300 generally will result in a greater implant depth of microbubbles 301. Greater implant dose of the species 300 generally will result in a greater concentration of the species 300 that form the microbubbles 301.

The formation of the microbubbles or micropores is a combination of two phenomena. Following an implant process, vacancies are generated in the substrate, as are interstitials. The density of defects tends to be higher where the dopant distribution (such as species 300) is highest. The density of interstitials is highest in an area beyond this range, called the end-of-range (EOR) area. The area of the substrate 138 above (towards the surface) the end-of-range is a high stress area. This high stress area typically collapses and forms slip-lines and/or micro dislocations during an anneal cycle. These micro dislocations are typically termed end-of-range defects. Vacancies that are created during the implant tend to migrate (or diffuse). These vacancies preferentially segregate towards the end-of-range area (or EOR defect area) due to the low Gibbs free energy of this area. This type of accumulation of vacancies tends to create pores or microbubbles. The second phenomenon is the affinity of hydrogen to this defective area. Due to hydrogen decoration, the pores grow larger and this enables larger microbubble formation.

Use of ultrasound energy to improve the cleaving of substrates may be applied to embodiments of SOI wafer fabrication or other cleaving implants such as 3D integrated circuit (IC) or stacked chip configurations. This process also may be applicable to the fabrication of substrates that are used in, for example, flat panels, thin films, solar cells, LEDs, other thin metal sheets, or other devices. The substrate that is cleaved using this process may be, for example, silicon, SiC, GaN, GaP, GaAs, polysilicon, Ge, quartz, or other materials known to those skilled in the art.

Figure 5:
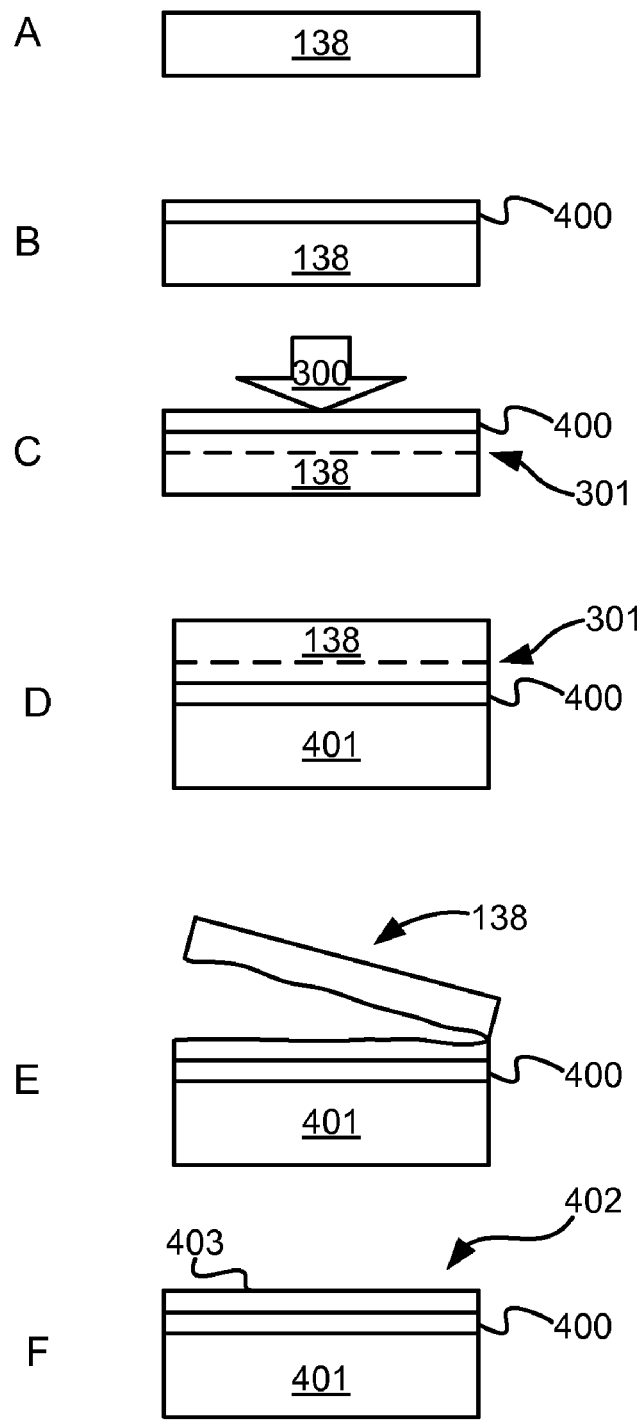
FIG. 5 is an embodiment of SOI wafer fabrication.

FIG. 5 is an embodiment of SOI wafer fabrication. In fabricating an SOI wafer, a substrate 138 is provided (A). The substrate 138 may be referred to as a donor wafer. The substrate 138 has a thermal oxide layer 400 formed on at least one surface (B). At least one species 300, such as hydrogen or helium, for example, is then implanted into the silicon of the substrate 138 to form a layer of microbubbles 301 (C). This substrate 138 is then flipped over, bonded to a handle wafer 401, and annealed (D). In some embodiments, the substrate 138 is cleaned prior to bonding it to the handle wafer 401.

During the anneal or another thermal process, the substrate 138 fractures or cleaves along the layer of microbubbles 301 (E). The formed SOI wafer 402, including the thermal oxide layer 400 and silicon overlayer 403, may require polishing to make the surface smooth enough for device manufacture (F). In another embodiment, a mechanical, chemical, or fluid force is used to fracture or cleave the substrate 138 along the layer of microbubbles 301. The remaining substrate 138 may be reused in some embodiments.

Figure 6:
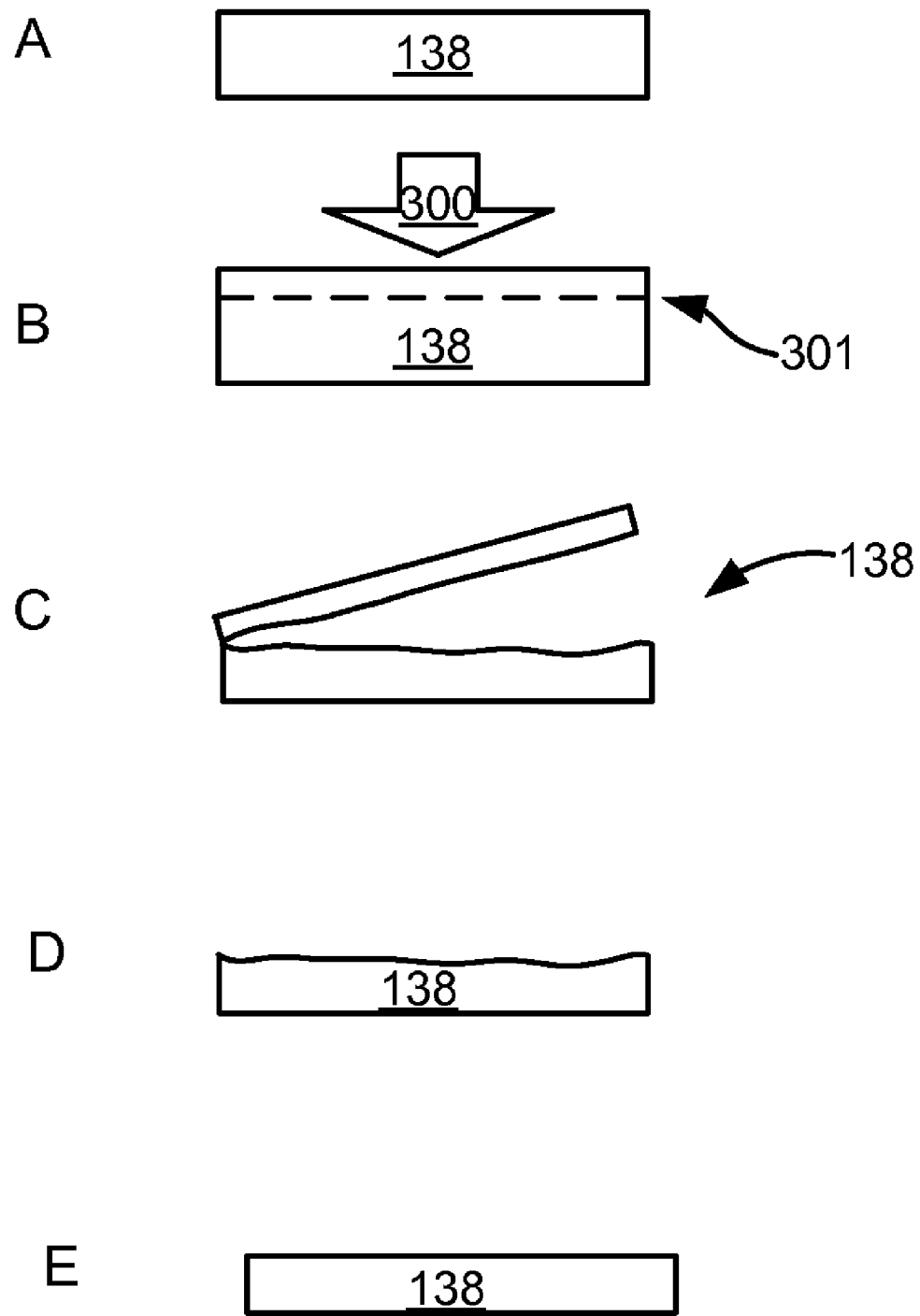
FIG. 6 is an embodiment of cleaving.

FIG. 6 is an embodiment of cleaving, such as for thin films, solar cells, or 3D IC. In fabricating a cleaved substrate, a substrate 138 is provided (A). The substrate 138 may be referred to as a donor wafer. The substrate 138 is not limited to silicon and can be made of other materials to those known skilled in the art, such as but not limited to gallium arsenide, gallium nitride, silicon carbide, gallium phosphide, indium phosphide, GaInP, AlGaInN, polysilicon, germanium, quartz and other species. At least one species 300, such as hydrogen or helium, for example, is implanted into the substrate 138 to form a layer of microbubbles 301 (B). During an anneal or another thermal process, the substrate 138 fractures or cleaves along the layer of microbubbles 301 (C). In another embodiment, a mechanical, chemical, or fluid force is used to fracture or cleave the substrate 138 along the layer of microbubbles 301. The remaining substrate 138 that is cleaved off may be reused in some embodiments. In another particular embodiment, the substrate 138 is bonded to another substrate prior to fracturing or cleaving the substrate 138 along the layer of microbubbles 301. The cleaved substrate 138 (D) is then polished in a chemical mechanical planarization process (CMP) to make the surface smooth enough for device manufacture (E).

Coupling the ultrasonic source to the substrate may improve results. In some embodiments, the coupling is performed at the back of the substrate. In other embodiments, there may be advantages to coupling to the sides of the substrate or to the front surface.

Figure 7A:
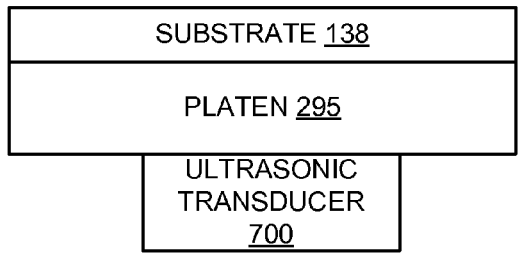
FIGS. 7A-D are cross-sectional views of embodiments of an apparatus that provides ultrasound energy.

FIGS. 7A-D are embodiments of an apparatus that provides ultrasound energy. A substrate is disposed on the platen 295. This platen 295 may have backside cooling or heating in one embodiment. In the embodiment of FIG. 7A, the ultrasonic transducer 700 is disposed on the back of the platen 295. This ultrasonic transducer 700 may be, for example, a piezo element. The piezo element may be lithium niobate, cadmium sulfide, or a piezo ceramic material, such as lead zirconate titanate (PZT), that uses an acoustic link. If an alternating voltage is applied to the piezo element, the piezo element will lengthen and shorten cyclically at the frequency of the applied voltage, thereby generating ultrasound energy. Oils configured for operation in vacuum may be used as couplers or binders in one embodiment. The piezo crystal may be energized using a ground and a metal contact.

Figure 7B:
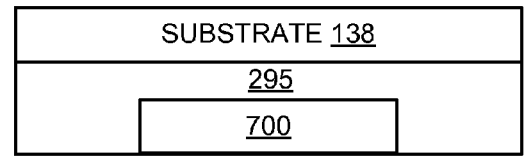
Figure 7C:
Figure 7D:
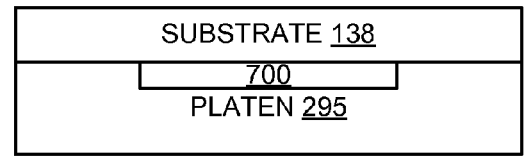

The embodiment of FIG. 7B has the ultrasonic transducer 700 embedded within the platen 295. FIG. 7C has at least two embedded ultrasonic transducers 700 radially disposed around the platen 295. In another embodiment, the ultrasonic transducers 700 are radially disposed on the surface of the platen 295 opposite the substrate 138 rather than being embedded within the platen 295. FIG. 7D has an ultrasonic transducer 700 disposed between the substrate 138 and the platen 295. The ultrasonic transducer 700 may cover only part of the platen 295, as seen in FIG. 7D, or may cover the entire surface of the platen 295. In another embodiment, the ultrasonic transducer 700 may be placed on the sides of the platen 295.

While this platen 295 and ultrasonic transducer 700 may be used within an ion implanter, such as the beam-line ion implanter 200, the platen and ultrasonic transducer 700 may be used, for example, in the end station or load lock of an ion implanter or in a location external to the ion implanter. The ultrasonic transducer 700 may be disposed on or in another substrate-holding apparatus, such as, for example, those used for anneal the substrate 138.

The ultrasonic transducer 700 will impinge energy into the lattice of the substrate 138. The lattice of the substrate, thus, may move longitudinally. Larger cavities caused by microbubbles will vibrate differently than smaller cavities. The microbubbles may cluster together due to application of ultrasound energy. This clustering of microbubbles to form larger cavities may be at least partly caused by or may supplement Ostwald ripening in one instance.

The use of ultrasound energy on the substrate induces lattice vibrations. These lattice vibrations, in turn, produce phonons. The diffusion and segregation of vacancies and hydrogen is enhanced in the presence of phonons or phonon energy. For example, the hydrogen passivation of defect sites (such as EOR defects, silicon vacancies and dislocations) or grain boundaries has been shown to be enhanced by using ultrasound vibrations on the substrate. This is due to enhanced diffusion of hydrogen in the presence of lattice energy.

Use of ultrasound energy during implantation of a species to form microbubbles or cavities may enable a narrow straggle profile. This narrow straggle profile may be desired for high-efficiency cavitation and cleaving. Straggle is defined as depth range at which the cavities are located. A wide straggle implies that many cavities are located outside the depth range where the microbubbles or cavities are desired. Conversely, a narrow straggle means most cavities are within the desired depth range. With ultrasound energy, straggle may be reduced, which may lead to a smoother cleaved substrate. Ultrasound energy may allow more efficient aggregation of species at a given depth within a substrate. Thus, ultrasound energy will drive a lower threshold to cause cavitation.

Figure 8:
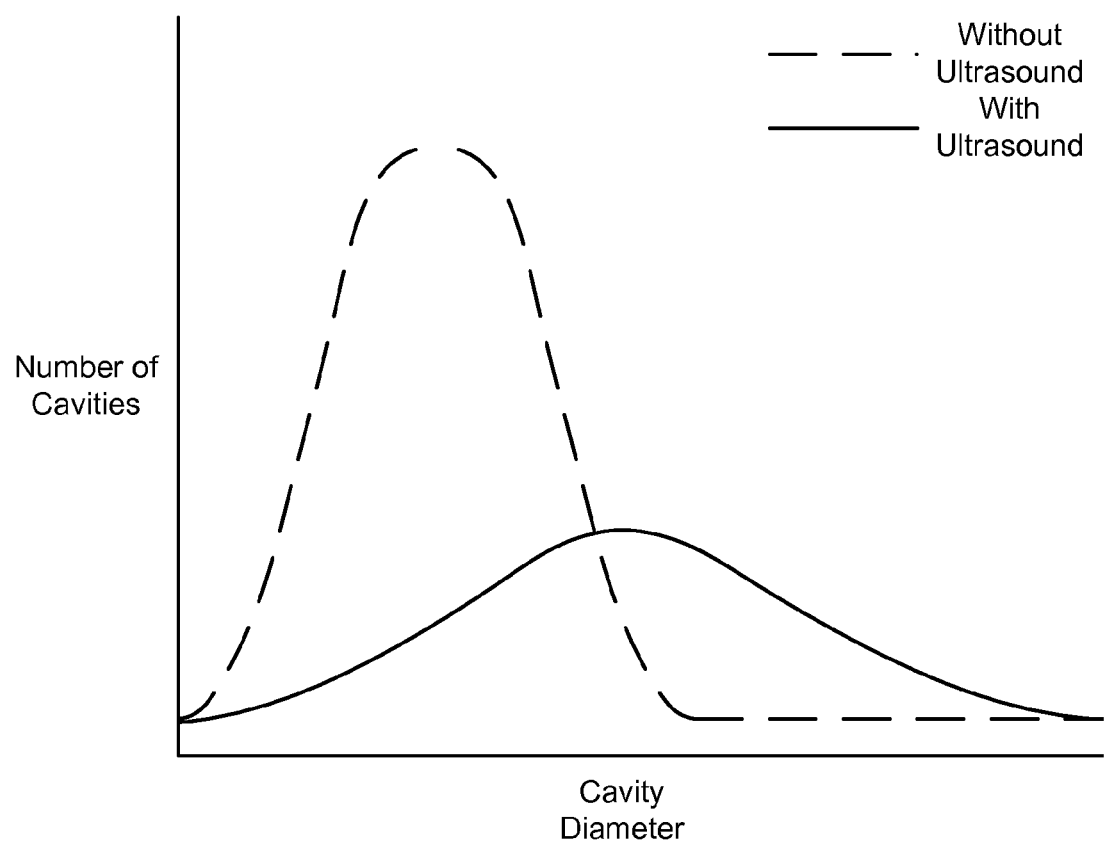
FIG. 8 is a graph comparing number of cavities versus cavity diameter for implants with and without ultrasound.

FIG. 8 is a graph comparing number of cavities versus cavity diameter for implants with and without ultrasound. An implanted species that is subject to ultrasound will agglomerate. This agglomeration is a cluster of microbubbles that forms a larger cavity. Thus, compared to an implant not subjected to ultrasound, an implant subjected to ultrasound will have fewer cavities, but these cavities will have a larger average diameter. Having larger cavities formed using an implanted species may improve cleaving of a substrate.

Figure 9:
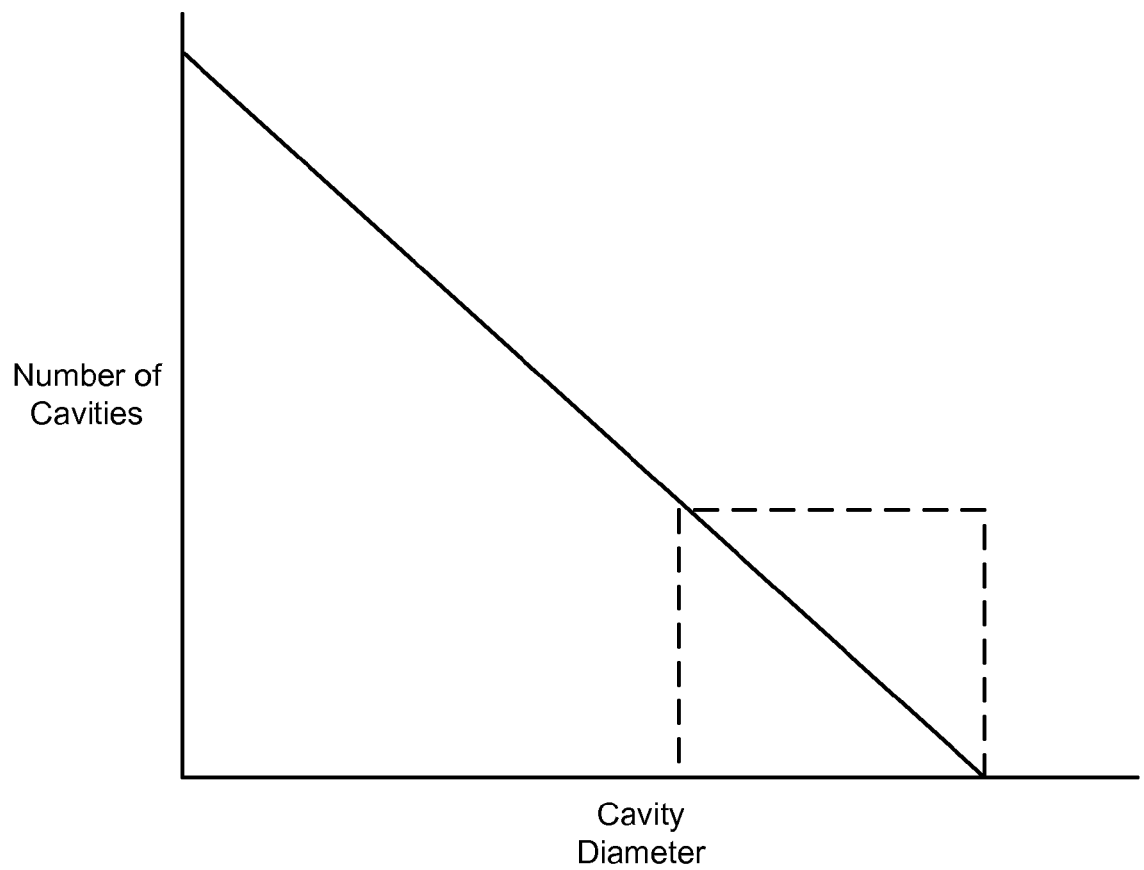
FIG. 9 is a graph comparing the number of cavities versus the cavity diameter.

FIG. 9 is a graph comparing the number of cavities versus the cavity diameter. As the number of cavities increases, the average size of each cavity decreases if the amount of the implanted species remains approximately constant. An optimized implant may have fewer, larger diameter cavities (represented by the region outlined by the dotted line in FIG. 9).

Figure 10:
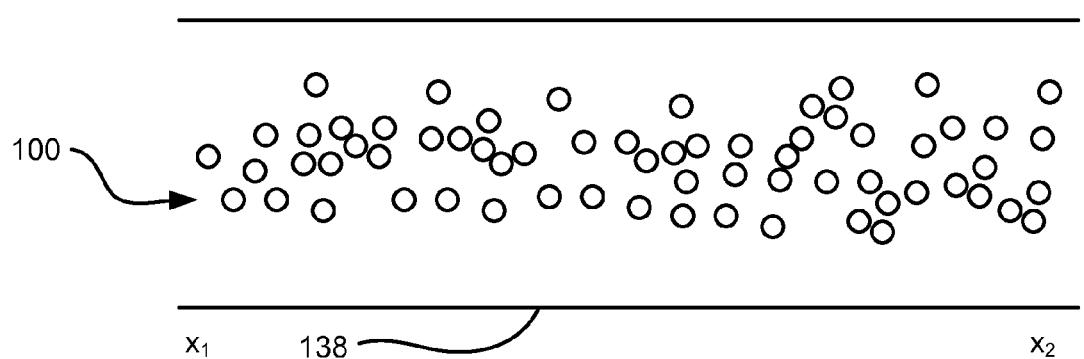
FIG. 10 is an embodiment of a substrate implanted without ultrasound.
Figure 11:
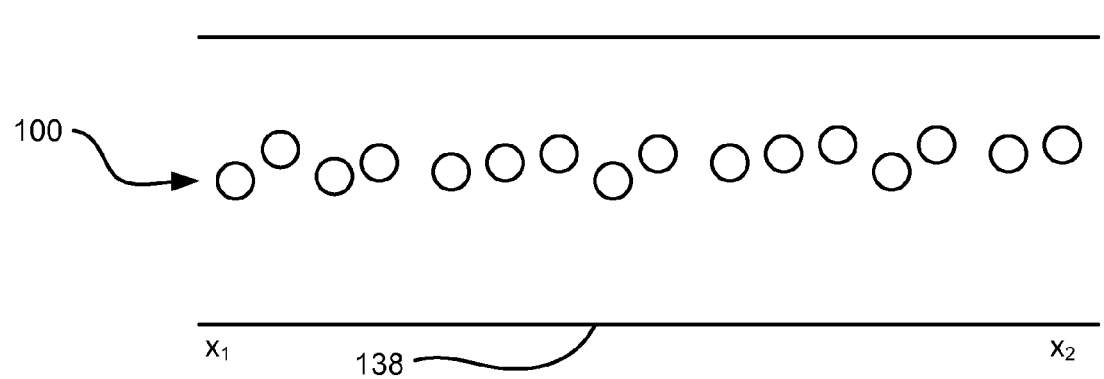
FIG. 11 is an embodiment of a substrate implanted with ultrasound.

FIG. 10 is an embodiment of a substrate implanted without ultrasound and FIG. 11 is an embodiment of a substrate implanted with ultrasound. FIGS. 10-11 are merely an illustration and are not to scale, although the $x_1$ and $x_2$ references will allow comparison of FIGS. 10-11. As seen in FIG. 10, an implant without ultrasound will result in a large number of small microbubbles 100 in substrate 138. Furthermore, the depth of these microbubbles 100 is varied. An implant with ultrasound will result in a fewer number of larger microbubbles 100 in substrate 138, as seen in FIG. 11. In addition, most microbubbles 100 are located at nearly the same depth.

Ultrasound energy may be induced during implant (in-situ) or after implant (ex-situ). An ex-situ ultrasound application may be performed prior to cleaving, prior to bonding, prior to anneal, during anneal, or during cleaving, for example. Use of a separate platform, similar to that illustrated in FIGS. 7A-7D, may be used for ex-situ ultrasound applications.

In one particular embodiment, the species is implanted with a power range of approximately 50 to 500 W/cm$^2$. The ultrasound energy between approximately 0.01 to 100 MHz is applied to the substrate. Application of ultrasound energy to a substrate may not lead to any increase in temperature of the substrate, although a slight increase in temperature is possible.

In general, ultrasound energies in the range of approximately 0.01-100 MHz can be used. As explained above, the preferred diffusion and segregation characteristics of both vacancies and gas species (like hydrogen) enable the formation of the microbubbles. These two characteristics respond slightly different to regiments of ultrasound energies and frequencies.

Specifically, the hydrogen diffusion within certain substrates (especially within polycrystalline silicon or multicrystalline silicon) can be significantly enhanced by using frequencies in the range of approximately 10-800 kHz. The process may also be significantly enhanced by increasing the substrate temperature from room temperature to around 120-200° C., although higher temperatures may tend to cause hydrogen to diffuse from the substrate.

Ultrasound frequencies in the range of approximately 500 kHz to 2 MHz may enhance the migration or diffusion of vacancies. Frequencies up to about 7 MHz enhance the migration or diffusion of both vacancies and point defects (interstitials). Based on these results, frequencies lower than about 7 MHz may be the preferred regime of treatment.

In one embodiment, ultrasonic energy in the range of approximately 10 kHz to 7 MHz is used. In a further or alternative embodiment, the temperature of the ambient environment may be elevated to between about 120 to 200° C., to enhance diffusion of hydrogen.

In a separate embodiment, an ultrasonic transducer 700 can be actuated at a higher frequency for a given time period (to enhance vacancy migration) followed by a time duration at a lower frequency to allow for hydrogen diffusion. Alternatively, the lower frequency can be applied first, followed by the application of a higher frequency energy. In another embodiment, there can also be alternating periods of high and low frequencies.

The optimal duration of ultrasonic treatment (UST) may be a function of the thickness of the substrate, whereby thicker substrates require longer treatment times. In one embodiment, the treatment duration for substrates having thicknesses between 100-500 um is about 5-10 minutes. This UST treatment can be performed in situ or ex situ. As explained above, it may be performed simultaneously along with other processes (such as implant, anneal, etc.).

In one instance, the current density of the species implant is sufficiently high to generate sufficient lattice vibration in the substrate. This may be coupled with ultrasound energy that is applied from the back of the substrate using a piezo reflector in the platen.

Following an implant of a species into a substrate with an in-situ ultrasound, the substrate can be annealed, affixed to a second substrate, and cleaved. The shear force needed for cleaving may be reduced due to the enhanced cavitation or increased agglomeration of cavities caused by microbubbles. Since the cavities formed may be larger and fewer in number, the mean roughness of the cleaved area may be reduced.

Equalization of cavity size using ultrasound also may reduce mean roughness of the cleaved area. This would improve the margin for cleaved surface polishing and reduce silicon or substrate loss.

Use of ultrasound to improve cleaving has numerous benefits. Formation of cavities is accelerated because there is less straggle in the species distribution profile (as illustrated in FIGS. 8, 10, and 11). The implant performed may be more efficient because a lower dose is needed to cleave since the microbubbles will agglomerate into larger cavities. Uniformity across the substrate is improved because the agglomeration of microbubbles will reduce variation across the substrate. Lighter species, such as hydrogen or helium, may cause a non-uniform implant into a substrate. Areas where the implant was non-uniform may be evened out due to the application of ultrasound. Furthermore, application of ultrasound may be configured to specifically compensate for non-uniformities. Ultrasound also may reduce substrate loss during post-cleaving polishing. The substrate after an ultrasound application may be less rough and have fewer peaks due to a more even cleaving.

The terms and expressions which have been employed herein are used as terms of description and not of limitation, and there is no intention in the use of such terms and expressions of excluding any equivalents of the features shown and described (or portions thereof). It is also recognized that various modifications are possible within the scope of the claims. Other modifications, variations, and alternatives are also possible. Accordingly, the foregoing description is by way of example only and is not intended as limiting.

What is claimed is:

1. A method of cleaving a layer from a substrate, comprising:
    implanting ions of a gaseous species into said substrate;
    applying ultrasonic energy to said substrate after said implanting said ions; and
    cleaving said substrate after said applying said ultrasonic energy using at least one of a thermal, mechanical, chemical, or fluid process.

2. The method of claim 1, wherein said applying of ultrasonic energy occurs during an annealing step.

3. The method of claim 1, wherein said ultrasonic energy is between 10 kHz and 100 MHz.

4. The method of claim 3, wherein said ultrasonic energy is less than 7 MHz.

5. The method of claim 1, wherein said ultrasonic energy is applied at a plurality of frequencies.

6. The method of claim 5, wherein said ultrasonic energy is applied at a first frequency to enhance the diffusion of said gaseous species and at a second frequency to enhance migration of vacancies caused by said implanting.

7. The method of claim 6, wherein said first frequency is less than 2 MHz.

8. The method of claim 6, wherein said second frequency is greater than said first frequency and less than 7 MHz.

9. The method of claim 5, wherein said applying comprising applying energy at a first frequency for a first predetermined duration and applying energy at a second frequency for a second predetermined duration.

10. The method of claim 1, wherein said implanting said ions forms a layer of microbubbles of a first size and wherein said applying said ultrasonic energy causes said microbubbles to agglomerate into a second size larger than said first size.

11. A method of cleaving a layer from a substrate, comprising:
    implanting ions of a gaseous species into said substrate;
    applying ultrasonic energy to said substrate during said implanting, wherein said implanting said ions forms a layer of microbubbles of a first size and wherein said applying said ultrasonic energy causes said microbubbles to agglomerate into a second size larger than said first size;
    annealing said substrate after said implanting; and
    cleaving said substrate after said annealing using at least one of a thermal, mechanical, chemical, or fluid process.

12. The method of claim 11, wherein said ultrasonic energy is between 10 kHz and 100 MHz.

13. The method of claim 12, wherein said ultrasonic energy is less than 7 MHz.

14. The method of claim 11, wherein said ultrasonic energy is applied at a plurality of frequencies.

15. The method of claim 14, wherein said ultrasonic energy is applied at a first frequency to enhance the diffusion of said gaseous species and at a second frequency to enhance migration of vacancies caused by said implanting.

16. The method of claim 15, wherein said first frequency is less than 2 MHz.

17. The method of claim 15, wherein said second frequency is greater than said first frequency and less than 7 MHz.

18. The method of claim 14, wherein said applying comprising applying energy at a first frequency for a first predetermined duration and applying energy at a second frequency for a second predetermined duration.

* * * * *